United States Patent [19]

Shinohara

[11] Patent Number: 5,742,934
[45] Date of Patent: Apr. 21, 1998

[54] FLASH SOLID STATE DISK CARD WITH SELECTIVE USE OF AN ADDRESS CONVERSION TABLE DEPENDING ON LOGICAL AND PHYSICAL SECTOR NUMBERS

[75] Inventor: Takayuki Shinohara, Tokyo, Japan

[73] Assignee: Mitsubishi Denki Kabushiki Kaisha, Tokyo, Japan

[21] Appl. No.: 613,670

[22] Filed: Mar. 11, 1996

[30] Foreign Application Priority Data

Sep. 13, 1995 [JP] Japan .................. 7-235229

[51] Int. Cl.[6] .................... G06F 12/10; G06F 12/00
[52] U.S. Cl. ................. 711/103; 711/115; 711/206; 711/202
[58] Field of Search ................. 395/430, 412, 395/419, 413, 416, 417, 402, 442, 421.11

[56] References Cited

U.S. PATENT DOCUMENTS

| | | | |
|---|---|---|---|
| 5,113,512 | 5/1992 | Miki et al. | 395/416 |
| 5,124,987 | 6/1992 | Milligan et al. | 395/430 |
| 5,359,570 | 10/1994 | Hsu et al. | 365/185.09 |
| 5,627,783 | 5/1997 | Miyauchi | 365/185.33 |

FOREIGN PATENT DOCUMENTS

| | | |
|---|---|---|
| 0522780 | 1/1993 | European Pat. Off. |
| 0548564 | 6/1993 | European Pat. Off. |
| 0613151 | 8/1994 | European Pat. Off. |

*Primary Examiner*—Glenn Gossage

[57] ABSTRACT

A flash solid state disk card comprises a flash memory comprising M block or M blocks and r redundant blocks, and an address conversion table which outputs a physical sector number 1 to N, or 1 to N and (M+1) to (M+r) in correspondence to an input of a logical sector number 1 to N. The number of blocks M is larger than N. If data in a block for a logical sector number (LSN) having a value L, equal to or less than N is updated, another data are erased in a block for a physical sector number (PSN) determined by the address conversion table, the data are written to a free block, and a physical sector number in correspondence to the logical sector number LSN=L in the address conversion table is changed to a number of the block to which the data to be updated are written. If a logical sector number (LSN) having a value L is equal to or less than N, data are read from a block for a physical sector number in correspondence to the logical sector number LSN=L in the table, otherwise data are read from a block for a physical sector number PSN=L. Thus, a flash solid state disk card can be used efficiently for a longer time. Preferably, a substitution table is provided for defective blocks to substitute a block for a defective block.

7 Claims, 7 Drawing Sheets

FLASH SOLID STATE DISK CARD WITH SELECTIVE USE OF AN ADDRESS CONVERSION TABLE DEPENDING ON LOGICAL AND PHYSICAL SECTOR NUMBERS

BACKGROUND OF THE INVENTION

1. Field of the Invention

The present invention relates to a flash solid state disk card including a flash memory which emulates a hard disk drive.

2. Description of the Prior Art

A flash memory is used in a semiconductor disk card as an erasable non-volatile memory medium. It is known that a flash memory has the following problems:

(a) Erasing is needed before a data write.

(b) A unit of data to be erased is a block as large as a few kilobytes to a few tens of kilobytes or an entire chip.

(c) A longer time is needed for writing or erasing than for reading.

(d) The number of writes is limited up to $10^4$–$10^6$ times/block.

When a flash solid state disk card using a flash memory emulates a hard disk drive, the following technique is used generally for a data update instruction from a host in the unit of a sector (or 512 kilobytes) in order to shorten the processing time: data in a sector designated by the host is not erased, while information indicating an invalid block is written to a sector ID (identification) for the sector, and the update data is written to a free area where data has already been erased. Thus, for each data update, an address (logical sector number) in the unit of sector designated by the host corresponds to a different address (physical sector number) of the flash memory to which the data is already written. Then, an address conversion table for storing the correspondence of logical sector number to physical sector number must be provided.

The size of the address conversion table becomes larger in proportion to a memory capacity of a flash memory. For example, a random access memory (RAM) of a capacity of a few megabits is needed for storing an address conversion table for a card of a memory capacity of a few tens of megabytes. This increases a cost, and it also increases an area required for mounting parts due to an increase in the number of parts.

Recently, a flash memory which can erase and write data in a unit of a sector has been developed exclusively for a flash memory card emulating a hard disk drive, and it is used for a flash solid state disk card. In this case, for each sector update instruction from the host, data in a sector designated by the host is erased, and update data are written thereto, so that the address conversion table is not needed.

In a known disk operating system available now, file names, file sizes, directory entries for storing top position data, and a file allocation table (FAT) storing positions of files and a structure thereof are stored in a specified area in a disk. The directory entries and the FAT are updated for each file data update. A directory entry for each file occupies 32 bytes. Directory entries of 16 files can be stored for each sector (512 bytes). For example, when four file data having directory entries in the same sector are updated, each sector for storing file data is updated only once, while the sector storing the directory entries is updated four times. As to FATs, similarly, an update number of a sector storing the FATs becomes larger than that of sectors storing data. Therefore, it is a problem that a life of the specified sector storing the FATs becomes shorter, and the life of the sector determines a life of the flash solid state disk card itself.

SUMMARY OF THE INVENTION

An object of the invention is to provide a flash solid state disk card which can use a flash memory for a longer time.

A first flash solid state disk card according to the present invention comprises a flash memory, and a random access memory storing an address conversion table which outputs a physical sector number for one of the N blocks in correspondence to an input of a logical sector number between 1 and N. The flash memory includes M blocks having physical sector numbers between 1 and M, and the M blocks includes N blocks for sector management (N<M). When data for a logical sector number L is written ($1 \leq L \leq N$) to a block, first, another data is erased in a block having a physical sector number determined by the address conversion table stored in the random access memory according to the logical sector number L, second, the data to be written is written to a free block among the N blocks, and finally a physical sector number in correspondence to the logical sector number L is changed in the address conversion table to a physical sector number of the block to which the data is written. "Free block" represents a virgin block to which data has not yet been written or a block where data has already been erased. On the other hand, when data for a logical sector number L larger than N is written, data is written to a block having a physical sector number equal to the logical sector number L without using the address conversion table. When the logical sector number L is equal to or less than N, data is read from a block for a physical sector number in correspondence to the logical sector number L in the address conversion table, otherwise data is read from a block for a physical sector number L.

A second flash Solid state disk card according to the present invention comprises a flash memory including (M+r) blocks having physical sector numbers between 1 and (M+r), where the blocks includes N blocks for sector management and r redundant blocks, and a random access memory storing an address conversion table which outputs a physical sector number for one of the N blocks and the r redundant blocks in correspondence to an input of a logical sector number between 1 and N, wherein N is smaller than M. When data for a logical sector number L is written ($1 \leq L \leq N$), first, another data is erased in a block having a physical sector number determined by the address conversion table according to the logical sector number L, second, the data is written to a free block among the N blocks and the r redundant blocks, and finally a physical sector number in correspondence to the logical sector number L in the address conversion table is changed to a physical sector number of the block to which the data is written. When data for a logical sector number larger than N is written, data is written to a block having a physical sector number equal to the logical sector number L. Data is read from a block for a physical sector number in correspondence to the logical sector number L in the address conversion table when the logical sector number L is equal to or less than N, otherwise data is read from a block for a physical sector number L.

Preferably, a substitution table is provided in the random access memory. When a defective block is found when data is written to a block in correspondence to a logical sector number, information on the defective block is written to a sector management area in the relevant block, and data on substitute blocks is written to the substitution table.

One advantage of the present invention is that the size of the address conversion table can be reduced.

Another advantage of the present invention is that the life of a flash solid state disk card becomes longer.

A third advantage of the present invention is that even a flash solid state disk card having initial defective blocks can be used.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
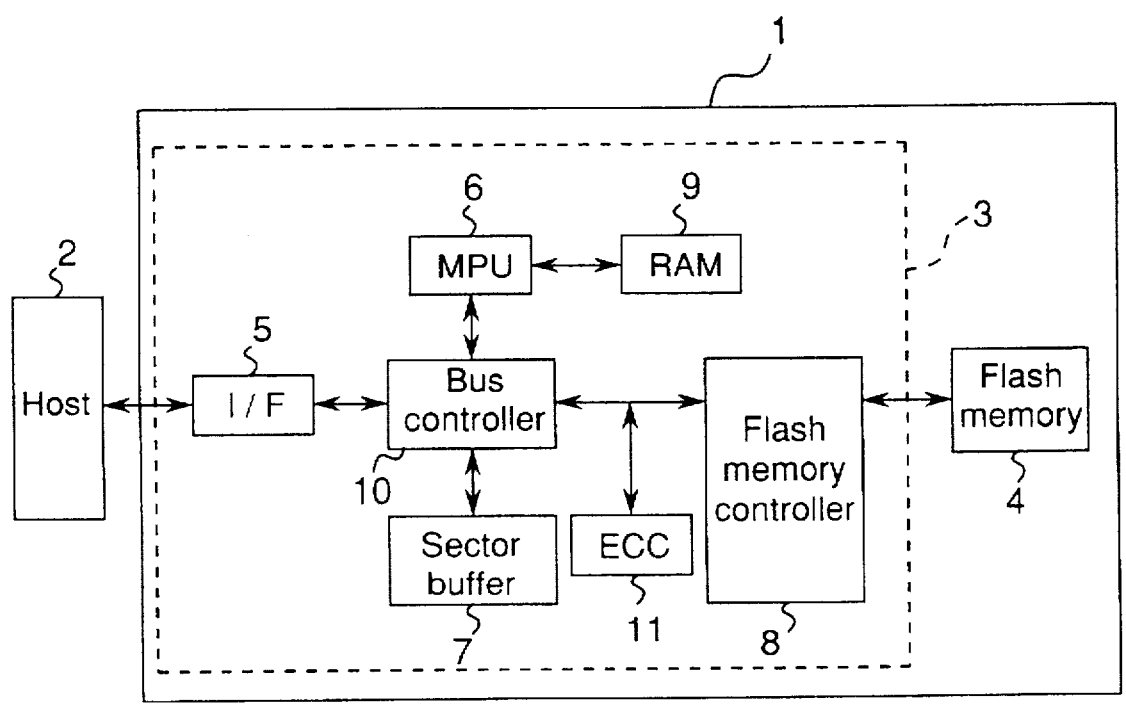
FIG. 1 is a block diagram of a flash solid state disk card of the present invention.

Referring now to the drawings, wherein like reference characters designate like or corresponding parts throughout the several views, FIG. 1 shows a block diagram of the flash solid state disk card 1 in one embodiment of the present invention. The flash solid state disk card 1 comprises a flash disk controller 3 and a flash memory 4. The flash disk controller 3 further includes a host interface circuit 5, a bus controller 10, a microprocessor (MPU) 6, a sector buffer 7, a random access memory (RAM) 9 storing a logical/physical address conversion table 91 (not shown), an error check code (ECC) circuit 11, and a flash memory controller 8. The controller 3 can be produced as an integrated circuit. A data write command or a data read command received from a host 2 is sent through the host interface circuit 5 and the bus controller 10 to the MPU 6. As will be explained later, the MPU 6 obtains a data of physical sector number in the flash memory 4 by referring to the logical/physical address conversion table 91 stored in the RAM 9. The flash memory controller 8 reads data from a sector accessed with the physical sector number in the flash memory 4, and writes the data to the sector buffer 7. The ECC circuit 11 checks errors in the data read.

Figure 2:
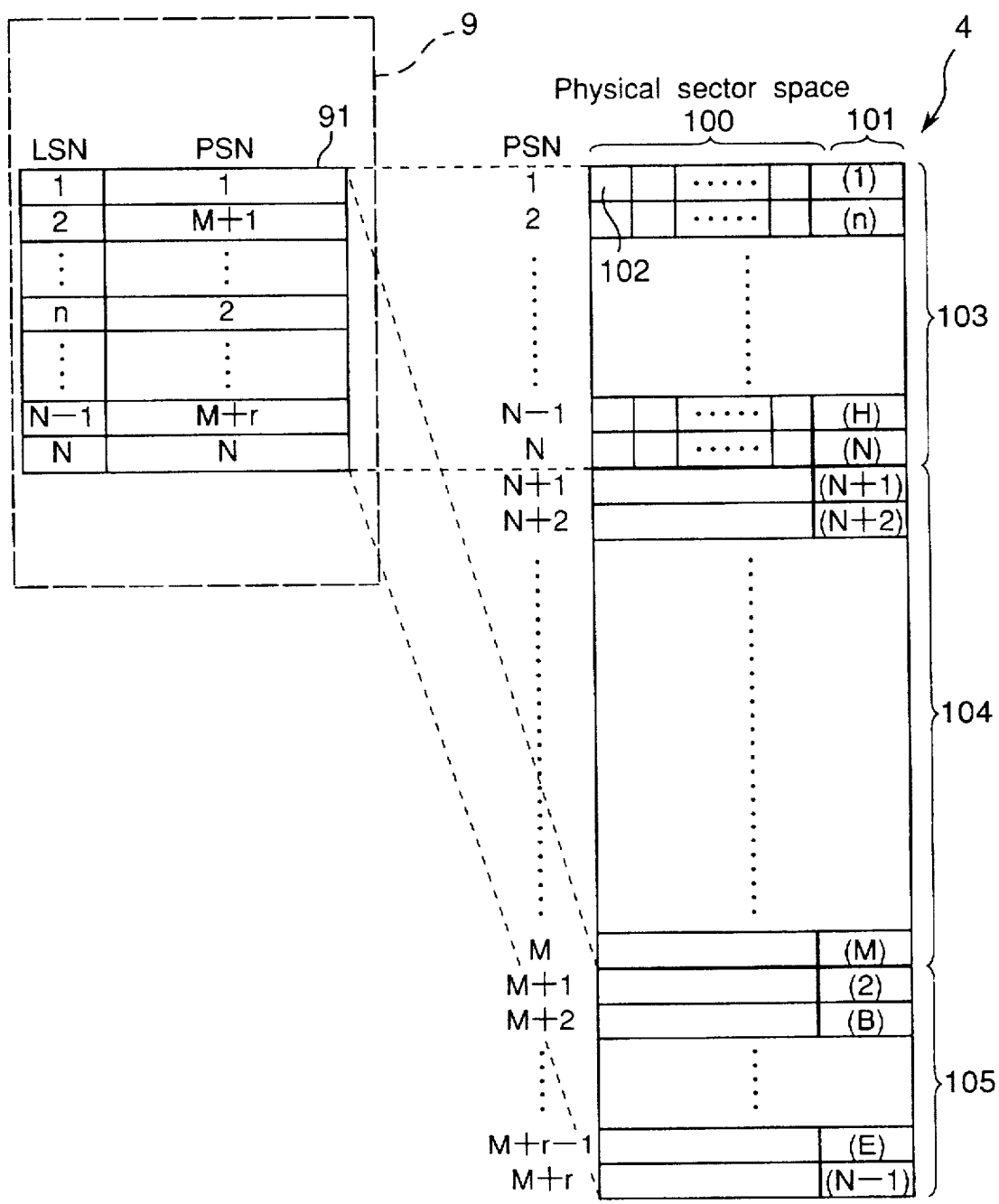
FIG. 2 is a diagram of a memory space in a flash memory and an address conversion table in a random access memory.

FIG. 2 shows erasing blocks in a memory space in the flash memory 4, and the address conversion table 91 in the RAM 9. The flash memory 4 includes M blocks and r redundant blocks, and erasing is performed in the unit of 512+16 bytes as in an AND-type flash memory. For each block, data of 512 bytes (which is equal to a size of a sector as a data access unit of a hard disk drive) is stored in a sector data area 100 of 512 bytes, while data such as a logical sector number (hereinafter referred also to as LSN) for the data (sector data), ECC data for the sector data, and a flag on the validity of the sector are stored in a sector management area 101 of 16 bytes.

The memory space of the flash memory 4 is divided into three areas 103, 104 and 105. The first area 103 includes blocks which will be updated frequently by the host 2, and includes blocks of physical sector numbers (hereinafter referred also to as PSN) 1 to N. A physical sector number accessed by the host 2 is determined by using the logical/physical address conversion table 91 stored in the RAM 9. Data to be stored in the first area 103 will be explained later. The second area 104 stores file data, and includes blocks of physical sector numbers (N+1) to M. For the second area 104, a physical sector number accessed by the host 2 is the same as the logical sector number. Therefore, the address conversion table is not used to access to a block in the second area 104. The third area 105 has r redundant blocks used as so-called extension areas for the first area 103, and includes blocks of physical sector number (M+1) to (M+r). In the example shown in FIG. 2, logical sector numbers 1 to N are assigned for sector management data, and the first area 103 is assigned for physical sector numbers 1 to N. Further, the host 2 sends a logical sector number up to M including a logical sector number not included in the second area 104. The third area 105 includes physical sector numbers above M. The positions of the first to third areas depend on the logical sector number sent by the host. The values of N and r are determined appropriately for improving performance of the flash solid state disk card 1.

In the logical/physical address conversion table 91 shown in FIG. 2, a logical sector number (LSN) received from the host 2 is shown at the left side of the table 91, while a physical sector number (PSN) output in correspondence to the logical sector number is shown in the table 91. Values of corresponding logical sector number are displayed in the sector management data area 101 with parentheses. The logical/physical address conversion table 91 in the RAM 9 is generated according to the logical sector numbers written to the sector management data area 101 in the first and third areas 101 and 103 when an electric power of the flash solid state disk card 1 is turned on.

Examples of data written to a block in the first or third area 103, 105 will be explained. In a disk operating system managing files using file names, file sizes, directory entries for storing top position data, and a file allocation table (FAT) storing positions of files and a structure thereof, this data is stored in the first or third area 103, 105. The directory entries and FATs are updated for each update of file data. Generally, a size for data of directory entries is 32 bytes. Therefore, a sector 512 bytes) can store data 102 of directory entries of 16 files. The flash memory 4 updates data in the unit of a block (512+16 bytes).

Previously, as explained above, when data of n files ($2 \leq n \leq 16$) having directory entries in the same sector are updated, data of the directory entries for the block are updated n times. That is, a block storing data of directory entries for a plurality of files is updated more frequently than a block storing file data.

When data in a block in the first area 103 or in the third area 105 are updated, the MPU 6 erases data in a block which has stored the data before the update and writes update data to a free block. A term "free block" represents a virgin block to which data has not yet been written or a block where data has already been erased. Then, the logical/physical address conversion table 91 is updated. Thus, blocks to which data is written are distributed, so data updates not are concentrated in specified blocks in the first and third areas 103, 105. Therefore, the number of update is decreased in specified blocks in the first area 103 and the update is performed uniformly in blocks, so that deterioration of specified blocks in the first area 103 can be reduced, and a flash solid state disk card can have a longer life. For example, if a number of the redundant blocks in the third area 105 is the same as that of the blocks in the first area 103, the number of updates for to each block in the first area 103 is halved, and the life of the card is doubled.

Figure 3:
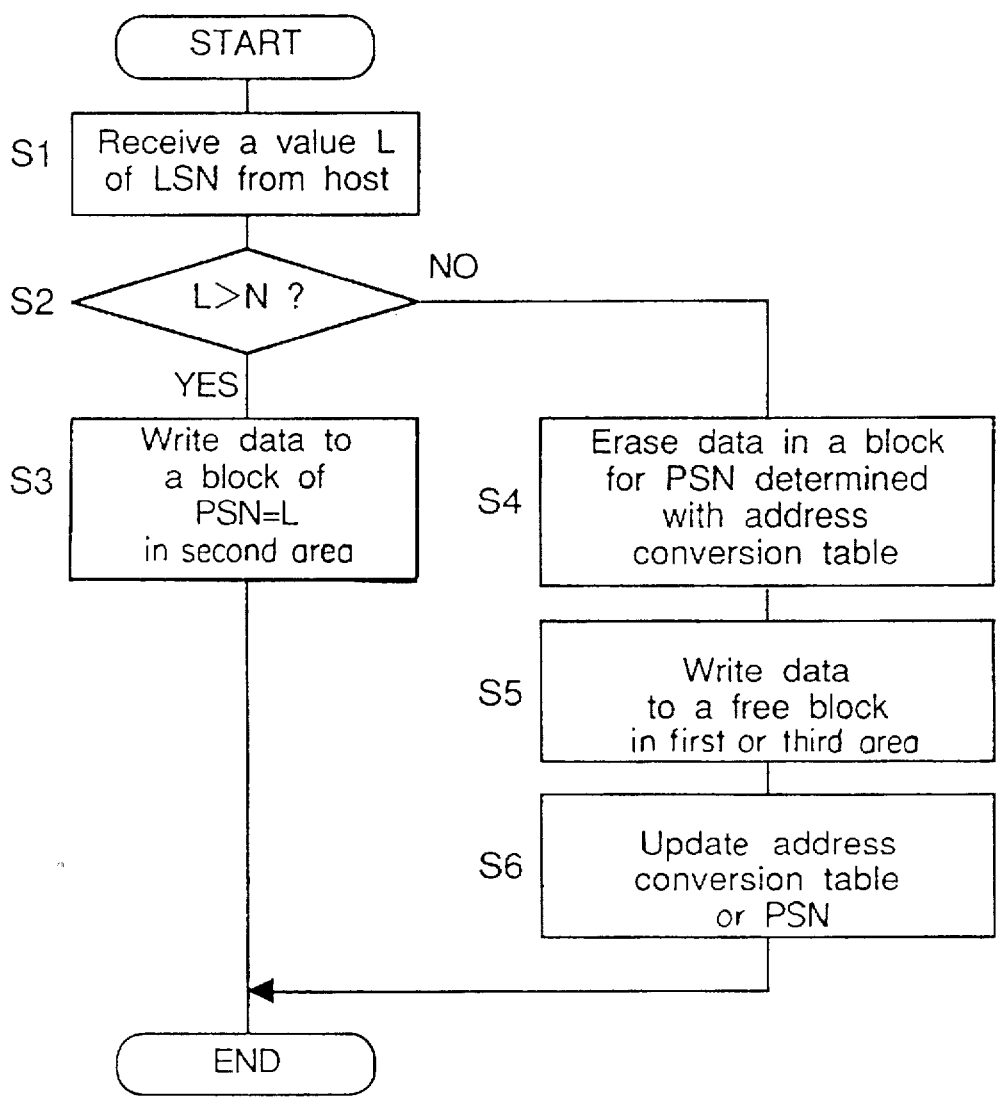
FIG. 3 is a flowchart of data write processing.
Figure 4:
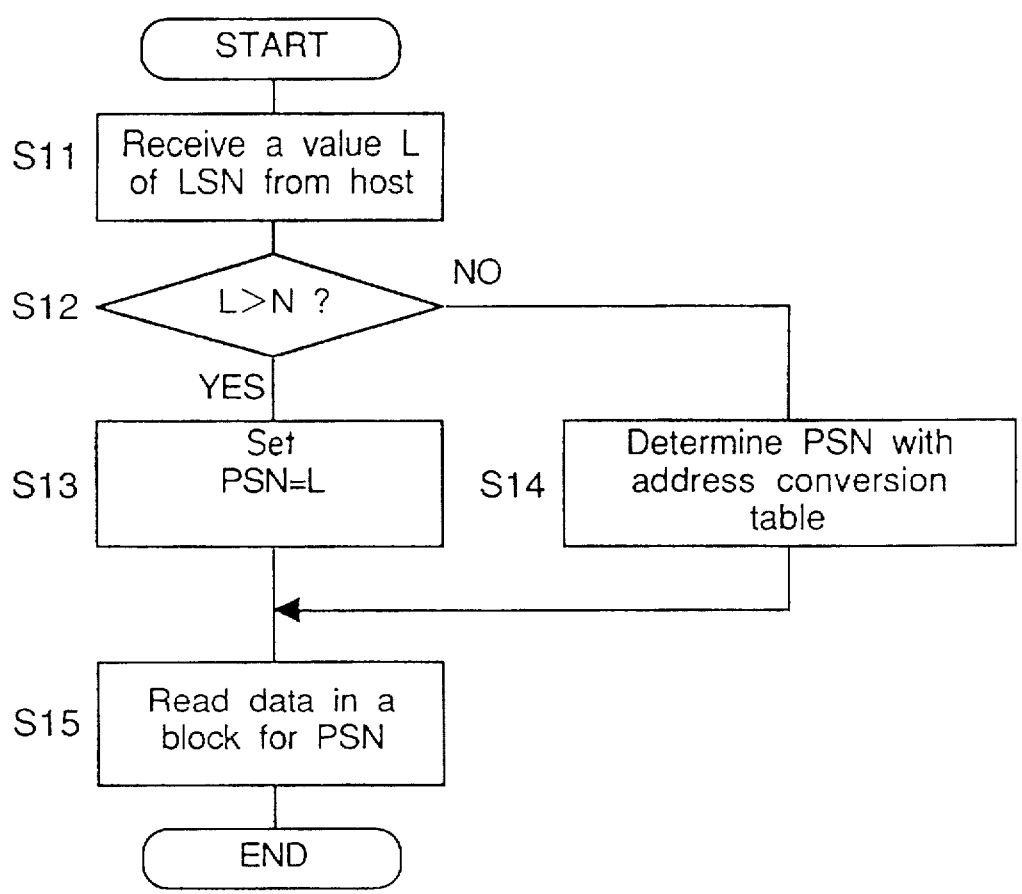
FIG. 4 is a flowchart of data read processing.

FIG. 3 shows a flowchart of data write processing performed by the MPU 6. First, a value L of a logical sector number (LSN) designated by the host 2 is obtained (step S1). If L is determined to be larger than N (YES at step S2), data is written to a block having a value L of a physical sector number (PSN) because the second area 104 is accessed (step S3). On the other hand, if L is determined to be not larger than N (NO at step S2), data are erased in a block having a value of a physical sector number determined with the logical/physical address conversion table 91 in the RAM 9 (step S4). Then, data are written to a free block among the blocks in the first or third area 103, 105 having physical sector numbers 1 to N or (M+1) to (M+r) (step S5). Then, the content in the logical/physical address conversion table 91 in the RAM 9 is updated, or a physical sector number in correspondence to the logical sector number LSN having the value L is updated to a number of the block to which data are written at step S5 (step FIG. 4 shows a flowchart of data read processing performed by the MPU 6. First, a value L of a logical sector number (LSN) designated by the host 2 is obtained (step S11). If L is determined to be larger than N (YES at step S12), a value of a physical sector number (PSN) is set as L because the second area 104 is accessed (step S13). On the other hand, if L is determined to be not larger than N (NO at step S12), a value of a physical sector number is determined using the logical/physical address conversion table 91 in the RAM 9 (step S14). Then, data are read from a block having the physical sector number set or determined at step S13 or S14 (step S15).

A feature of the flash solid state disk card explained above is that the address conversion table 91 is provided only for the areas 103 and 105 having blocks to be updated more frequently than file data in the second area 104 (or the areas 103 and 105 having physical sector numbers of 1 to N and (M+1) to (M+r)). The address conversion table 91 is not used for the area 104 including blocks for storing file data (or the area having physical sector numbers of (N+1) to M) and an input logical sector number (LSN) is taken as a physical sector number (PSN). Thus, an advantage of this embodiment is that a size of the address conversion table needed to access the flash memory can be reduced. This advantage is enjoyed even if the area 105 for redundant blocks is not provided. When data is written to a block in the specified area, data in the block to which the data is written is erased, while update data are written to a block in which data has already been erased.

Another feature of the present embodiment is that r redundant blocks are provided in the flash memory 4 to prevent concentration of data updates in blocks in the first area 103. Thus, concentration of data updates in particular blocks is prevented and deterioration of blocks in the first area 103 can be reduced. Therefore, the flash solid state disk card has a longer product life.

Figure 5:
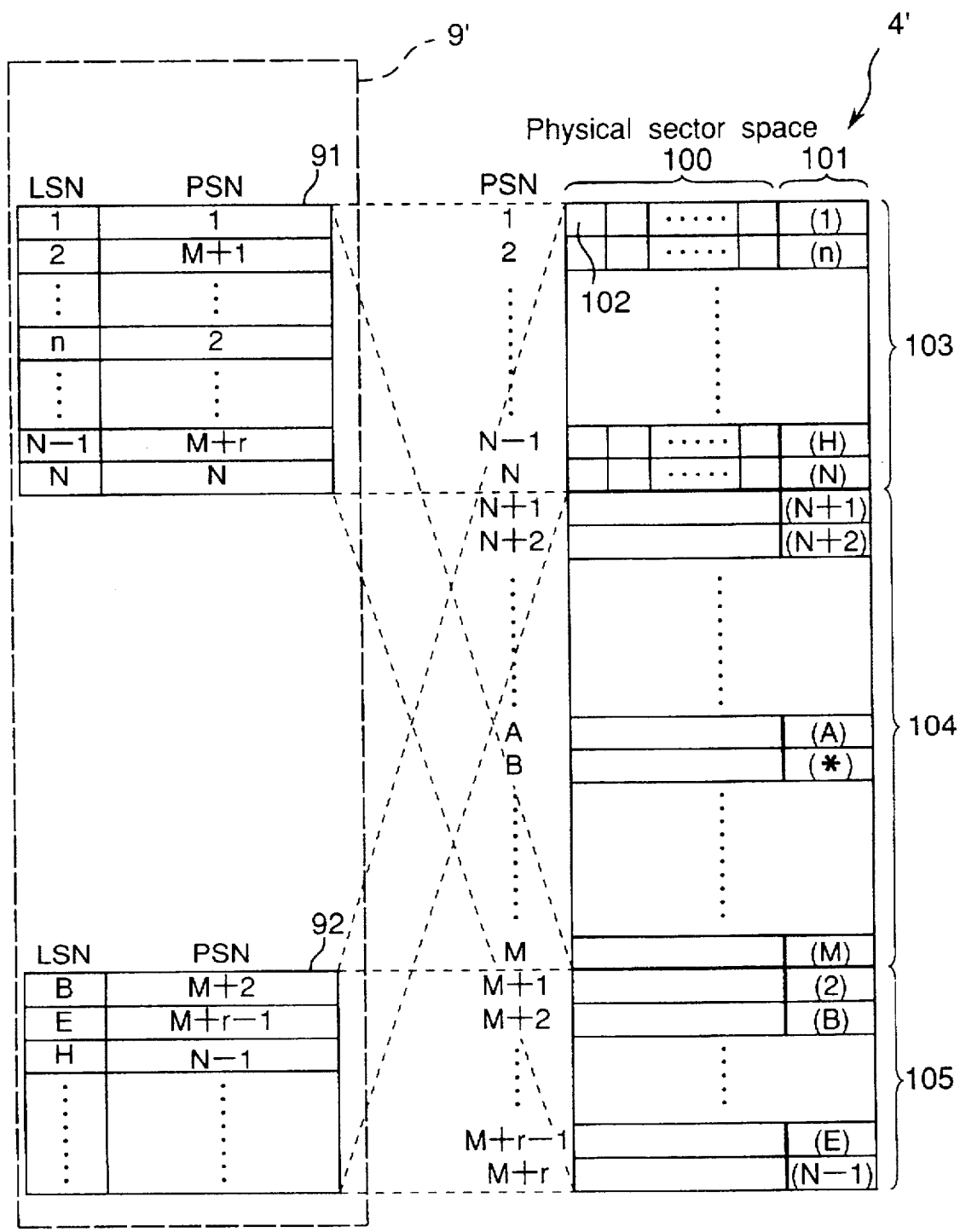
FIG. 5 is a diagram of the relation of memory space in a flash memory in a flash solid state disk card of a second embodiment, a physical/logical address conversion table stored in a RAM and a defective block substitution table.

Next, another embodiment of a flash solid state disk card is explained. Different types of a flash memory 4' and a RAM 9' are used instead of the flash memory 4 and the RAM 9 in FIG. 1. FIG. 5 shows the relation of a memory space in a flash memory 4' in the flash solid state disk card 1, a physical/logical address conversion table 91 and a defective block substitution table 92 stored in RAM 9'. That is, the RAM 9' has two kinds of tables, that is, the logical/physical address conversion table 91 for blocks in the first and third areas 103 and 105 in the memory space of the flash memory 4', and the defective block substitution table 92' for blocks in the third area 105. Like reference characters in FIG. 5 designate like or corresponding parts shown in FIG. 2. In order to avoid duplicate explanation, only a structure different from the flash solid state disk card 1 described above and operations and advantages thereof are explained here.

The third area 105 in the memory space of the flash memory 4' includes redundant blocks (physical sector numbers (M+1) to (M+r)), and they are used as extension blocks of the first area 103 and further as substitute blocks when a defect is generated in a block in the second area 104. The r redundant blocks are used similarly to blocks in the first area 103, except those blocks used as substitute blocks for defective blocks in the second area 104.

In the logical/physical address conversion table 91 and the defective block substitution table 92 shown in FIG. 5, a logical sector number (LSN) received from the host 2 is shown at the left side of the tables 91, 92, while a physical sector number (PSN) output in correspondence to the logical sector number is shown at the right side thereof. Values of the corresponding logical sector number are displayed in the sector management data area 101 with parentheses. Data (shown as * in FIG. 5) indicating a defective block is written instead of a logical sector number to a sector management data area 101 in a defective block in the second area 104 (see the block having a physical sector number B). The logical/physical address conversion table 91 in the RAM 9 is generated according to the logical sector numbers written to the sector management data area 101 in the first and third areas 101 and 103. Further, the defective block substitution table 92 is generated according to the logical sector numbers (N+1) to M written to the sector management data area 101 in the third area 105 in the flash memory 4'.

When a block in the second area 104 in the memory space of the flash memory 4' is accessed, an MPU 6 does not use the address conversion table 91 as in the first embodiment. Further, if a data meaning that the block is an invalid block including a defect or defects is written to a sector management area 101 for the block to be read, the MPU 6 refers to the defective block substitution table 92 and reads data in a redundant block in the third area 105 in correspondence to the physical sector number specified by the substitution table 92.

When data in a block in the first or third area, except blocks used as substitute blocks for defective blocks in the second area 104, are updated, the MPU 6 erases the data in the block to which the data have been stored, rewrites the logical/physical address conversion table 91, and writes update data to a free block in the first or third area. Thus, the MPU 6 distributes blocks to which data is written to prevent concentration of read operation to specified blocks.

In the flash solid state disk card 1 explained above, the defective block substitution table 92 is provided to substitute a defective block in the flash memory with a normal block provided in the third area 105. The substitution table 92 can register initial defective blocks as well as defective blocks caused by deterioration in use. Therefore, the life as a product of the flash solid state disk card can be lengthened. Further, a flash memory which has initial defects can be used, so that the cost of a flash solid state disk card can be reduced.

Figure 6:
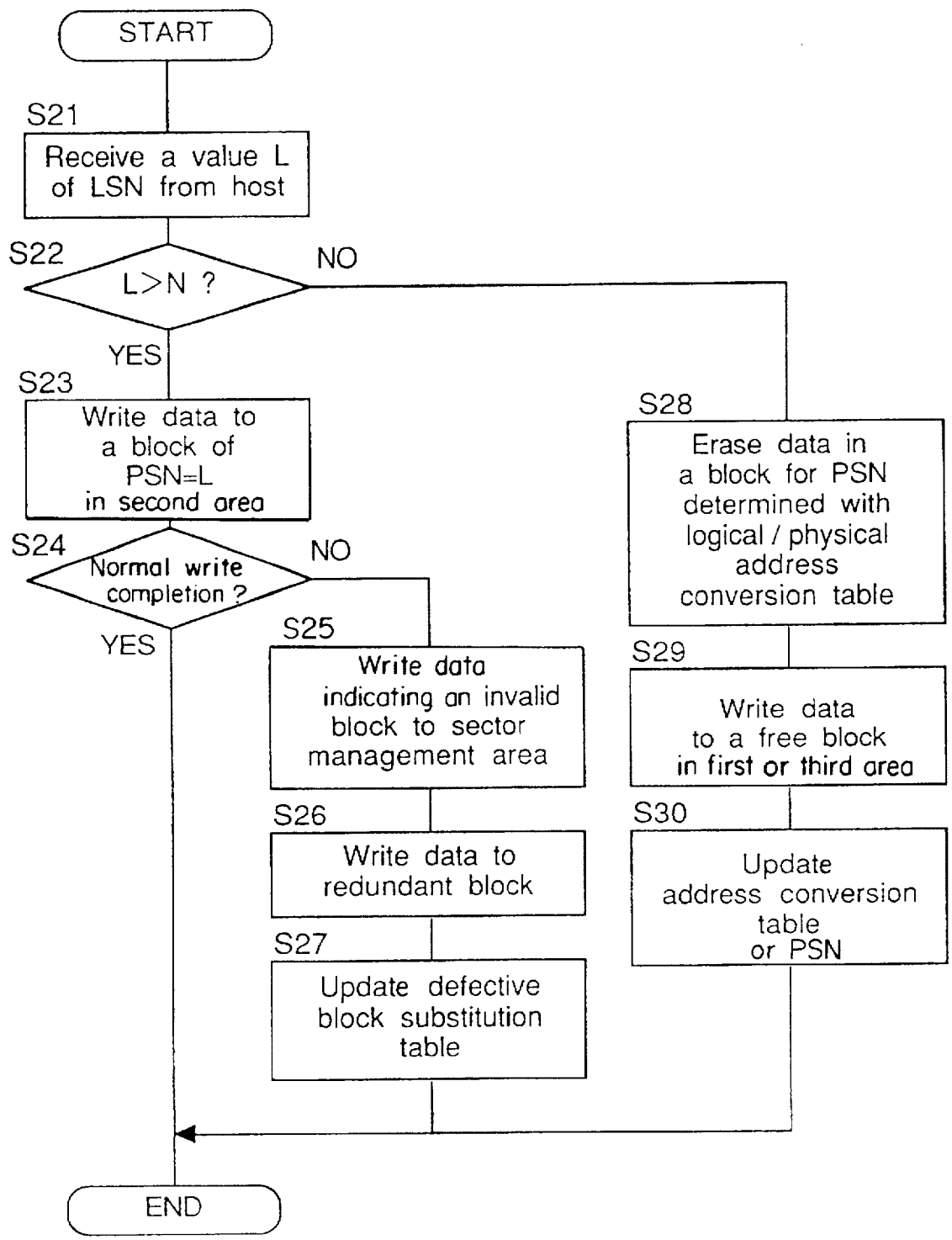
FIG. 6 is a flowchart of data write processing in the second embodiment of FIG. 5.

FIG. 6 is a flowchart of data write processing in the flash solid state disk card 1 performed by the MPU 6. First, a value L of a logical sector number (LSN) designated by the host 2 is obtained (step S21). If the value L is determined to be larger than N (YES at step S22), data is written to a block having a value L of a physical sector number (PSN) because the second area 104 is accessed (step S23). Then, if the data write is determined to has been completed normally (YES at step S24), the processing ends. However, if the data write does not complete normally (NO at step S24), data indicating an invalid block is written to the sector management data area 101 of the block (step S25), and data is written to a free block in the third area 105 (step S26). Further, the physical sector number of the block to which the data is written is written for the logical sector number L (L>N) to the defective block substitution table 92 in the RAM 9' (step S27).

On the other hand, if L is not determined to be larger than N (NO at step S22), data is erased in a block having a value of a physical sector number determined with the logical/physical address conversion table 91 in the RAM 9' (step S28). Then, data is written to a free block among the blocks in the first or third area 103, 105 having physical sector numbers 1 to N or (M+1) to (M+r) (step S29). Then, the content in the logical/physical address conversion table 91 is updated, or a physical sector number in correspondence to the logical sector number L is updated to a number of the block to which data is written at step S29 (step S30).

Figure 7:
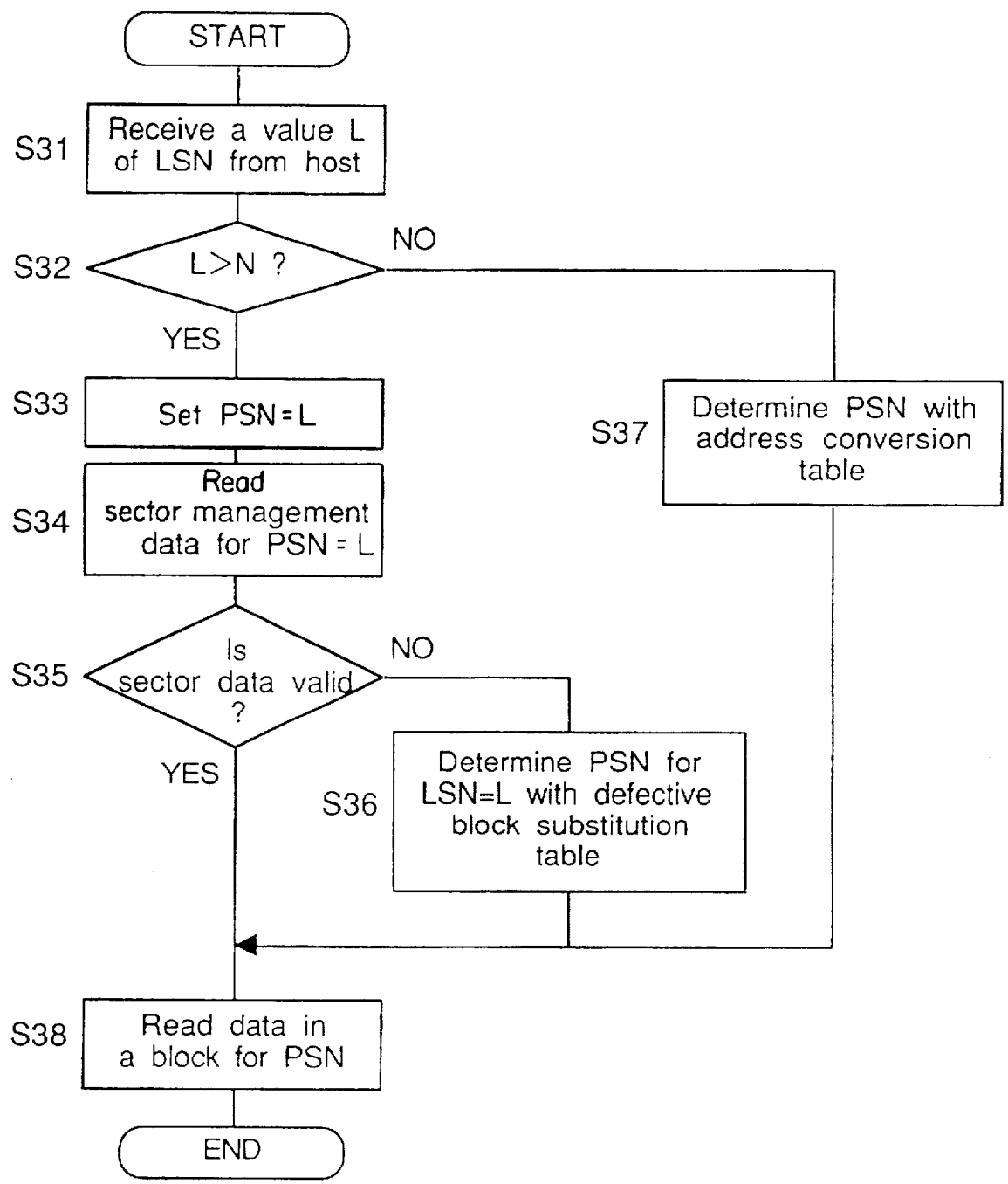
FIG. 7 is a flowchart of data read processing in the second embodiment of FIG. 5.

FIG. 7 is a flowchart of data read processing in the flash solid state disk card 1 performed by the MPU 6. First, a value L of a logical sector number (LSN) designated by the host 2 is obtained (step S31). If L is larger than N (YES at step S32), a value of a physical sector number (PSN) is set as L because the second area 104 is accessed (step S33). Then, the data written to a sector management data area 101 in a block of the physical sector number L is read (step S34). Then, if it is determined that data indicating an invalid block is not written or the block is a valid block (YES at step S35), data of the physical sector number L is read (step S38). On the other hand, if it is determined that data indicating an invalid block is written (NO at step S35), the physical sector number in correspondence to the logical sector number L is determined by referring to the defective block substitution table 92 in the RAM 9' (step S36). Then, data of the physical sector number L determined at step S36 is read (step S38).

On the other hand, if L is not determined to be larger than N (NO at step S32), a value of a physical sector number is determined with the logical/physical address conversion table 91 in the RAM 9' (step S37). Then, data of the physical sector number L determined at step S37 is read (step S38).

In the flash solid state disk card explained above, r redundant blocks are provided in the flash memory, and an address conversion table can also designate the redundant blocks. Deterioration of the flash memory due to concentration of data update in particular blocks is delayed more than in the flash solid state disk card in the first embodiment. Further, when a defect occurs in a block for which the address conversion table is not provided, a normal block among the redundant blocks is substitutes. Thus, a flash solid state disk card has a longer life as a product. Further, a flash memory device including initial defects can be used, and this decreases a cost.

Although the present invention has been fully described in connection with the preferred embodiments thereof with reference to the accompanying drawings, it is to be noted that various changes and modifications would be apparent to those skilled in the art. Such changes and modifications are to be understood as included within the scope of the present invention as defined by the appended claims unless they depart therefrom.

What is claimed is:

1. A flash solid state disk card comprising:

a flash memory having M blocks having physical sector numbers between 1 and M, the M blocks including N blocks for sector management, where N is smaller than M;

a random access memory storing an address conversion table which outputs a physical sector number for one of the N blocks in correspondence to an input of a logical sector number between 1 and N;

data write processing means for writing data to a block for a logical sector number L, said data write processing means including means for, if L satisfies a relationship of $1 \leq L \leq N$, erasing another data in a block having a physical sector number determined by the address conversion table stored in said random access memory according to the logical sector number L, writing the data to be written to a free block among the N blocks, and changing a physical sector number in correspondence to the logical sector number L in the address conversion table to a physical sector number of the block to which the data are written, and for, if the logical sector number L is larger than N, writing data to be written to a block having a physical sector number equal to the logical sector number L; and data read processing means for reading data from a block in said flash memory for a physical sector number in correspondence to the logical sector number L in the address conversion table in said random access memory if the logical sector number L is equal to or less than N, and for reading data from a block for a physical sector number L in said flash memory if the logical sector number L is larger than N.

2. The card according to claim 1, wherein each of the N blocks includes a sector data area and a sector management area, each sector management area storing a logical sector number in correspondence to a physical sector number.

3. The card according to claim 2, wherein each sector data area has 512 bytes and each sector management area has 16 bytes.

4. A flash solid state disk card comprising: a flash memory having (M+r) blocks having physical sector numbers between 1 and (M+r), the (M+r) blocks including N blocks for sector management and r redundant blocks;

a random access memory storing an address conversion table which outputs a physical sector number for one of the N blocks and the r redundant blocks in correspondence to an input of a logical sector number between 1 and N, wherein N is smaller than M;

data write processing means for, if a logical sector number L satisfies a relationship of $1 \leq L \leq N$, erasing another data in a block having a physical sector number determined according to the logical sector number L by the address conversion table stored in said random access memory, writing the data to be written to a free block among the N blocks and the r redundant blocks, and changing a physical sector number in correspondence to the logical sector number L in the address conversion table to a physical sector number of the block to which the data are written, and for, if the logical sector number L is larger than N, writing data to be written to a block having a physical sector number equal to the logical sector number L; and data read processing means for reading data from a block in said flash memory for a physical sector number in correspondence to the logical sector number L in the address conversion table in said random access memory if the logical sector number L is equal to or less than N, and for reading data from a block for a physical sector number L in said flash memory if the logical sector number L is larger than N.

5. The card according to claim 4, said random access memory further including a substitution table which stores logical sector numbers and physical sector numbers of substitute blocks for defective blocks determined for the logical sector numbers with the address conversion table, each block in said flash memory including a data area for writing data and a management data area for writing a logical sector number or data indicating a defective block, wherein said data write processing means further writes data indicating a defective block to the management data area for the block for the physical sector number L, writes data to a free block among the r redundant blocks, and writes the logical sector number L and a physical sector number for a block to which the data are written in the substitution table, if the logical sector number N is larger than L and a block for the physical sector number L has a defect, and said data read processing means further reads data of a redundant sector number from the substitution table for the physical sector number L if the logical sector number L is larger than N and data indicating a defective block is written to the management data area for the physical sector number L.

6. The card according to claim 4, wherein each of the N blocks and the r redundant blocks includes a sector data area and a sector management area, each sector management area storing a logical sector number in correspondence to a physical sector number.

7. The card according to claim 6, wherein each sector data area has 512 bytes and each sector management area has 16 bytes.

* * * * *